United States Patent
Wojnarowski et al.

[11] Patent Number: 5,554,305
[45] Date of Patent: Sep. 10, 1996

[54] PROCESSING LOW DIELECTRIC CONSTANT MATERIALS FOR HIGH SPEED ELECTRONICS

[75] Inventors: Robert J. Wojnarowski, Ballston Lake; Herbert S. Cole, Burnt Hills; Theresa A. Sitnik-Nieters, Scotia; Wolfgang Daum, Schenectady, all of N.Y.

[73] Assignee: General Electric Company, Schenectady, N.Y.

[21] Appl. No.: 411,178

[22] Filed: Mar. 27, 1995

Related U.S. Application Data

[62] Division of Ser. No. 247,820, May 23, 1994, Pat. No. 5,449,427.

[51] Int. Cl.$^6$ .............................................. H01L 21/3105
[52] U.S. Cl. ............................... 216/62; 216/65; 264/400
[58] Field of Search .................... 216/58, 62, 65, 216/66; 430/313, 315; 219/121.69; 264/400

[56] References Cited

U.S. PATENT DOCUMENTS

| | | | |
|---|---|---|---|
| 3,812,224 | 5/1974 | Smith et al. | 264/28 |
| 3,843,570 | 10/1974 | Murayama | 521/62 |
| 3,962,153 | 6/1976 | Gore | 521/79 |
| 4,096,227 | 6/1978 | Gore | 264/110 |
| 4,721,831 | 1/1988 | Vora | 174/255 |
| 4,751,136 | 6/1988 | Kamiya et al. | 428/317.1 |
| 4,783,695 | 11/1988 | Eichelberger et al. | 257/668 |
| 4,835,704 | 5/1989 | Eichelberger et al. | 364/490 |
| 5,034,801 | 7/1991 | Fischer | 357/72 |
| 5,087,641 | 2/1992 | Sato | 521/53 |
| 5,169,678 | 12/1992 | Cole et al. | 427/555 |
| 5,302,547 | 4/1994 | Wojnarowski et al. | 437/173 |

FOREIGN PATENT DOCUMENTS

| | | |
|---|---|---|
| 0333132 | 3/1989 | European Pat. Off. |
| 55001109 | 6/1978 | Japan |
| 2266181 | 10/1993 | United Kingdom |
| WO9001374 | 2/1990 | WIPO |
| WO9324313 | 12/1993 | WIPO |

OTHER PUBLICATIONS

"Fabrications Of Controlled Porosity In A Tape Cast Glass Ceramic Substrate Material", 6046 Materials Letters, 1989 Aug., No. 8, Amsterdam, NL, pp. 278–282.
"Fabrication Of Printed Circuit Wiring Boards Using Insulation Layers With Low Dielectric Constant", IBM Technical Disclosure Bulletin, vol. 31, No 7, Dec. 1988, pp. 25–26.
"UV–Laser Photoablation Of Thermostable Polymers: Polymides, Polyphenylquinoxaline And Teflon AF", Mat. Res. Soc. Symp. Proc vol 227, 1991 Materials Research Society, pp. 253–259.
"Giants In Advancecd Ceramics", Ceramic Industry, Aug. 1993, pp. 47–51.
Handbook Of Chemistry And Physics, 60th Ed., pp. C722–723.

*Primary Examiner*—R. Bruce Breneman
*Assistant Examiner*—Anita Alanko
*Attorney, Agent, or Firm*—Ann M. Agosti; Marvin Snyder

[57] ABSTRACT

A method for processing a low dielectric constant material includes dispersing an additive material in a porous low dielectric constant layer, fabricating a desired electronic structure, and then removing the additive material from the pores of the low dielectric constant layer. The removal of the additive material from the pores can be accomplished by sublimation, evaporation, and diffusion. Applications for the low dielectric constant layer include the use as an overlay layer for interconnecting a circuit chip supported by a substrate and the use as printed circuit board material.

5 Claims, 10 Drawing Sheets

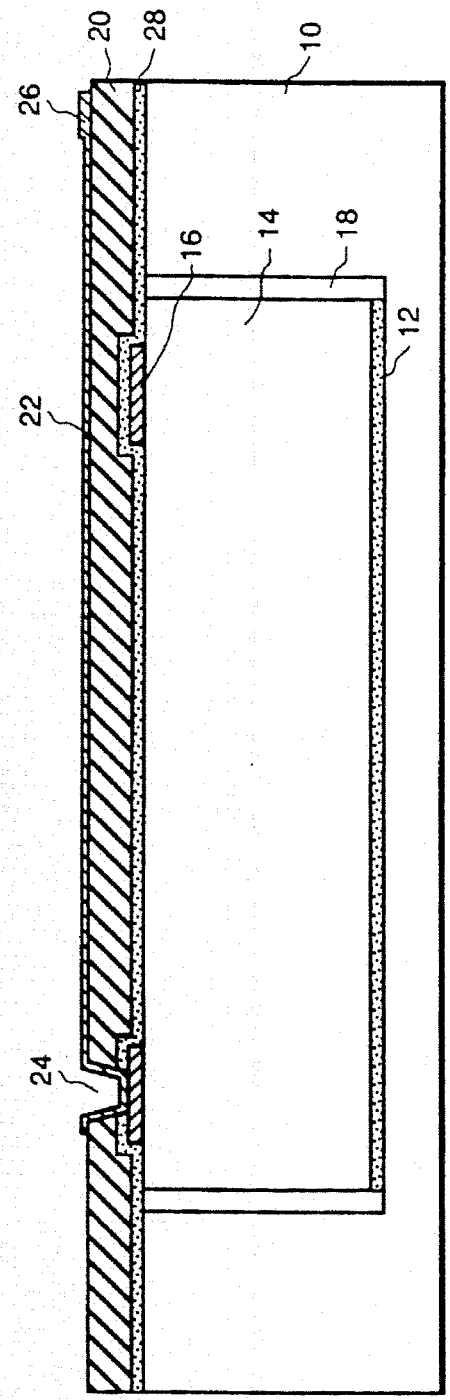
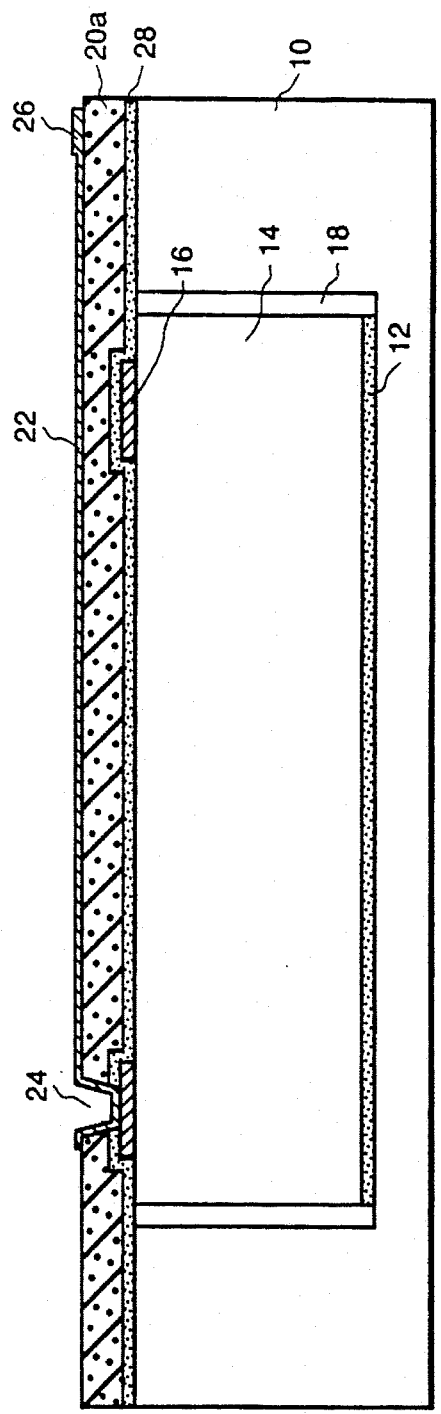
FIG. 8
FIG. 9

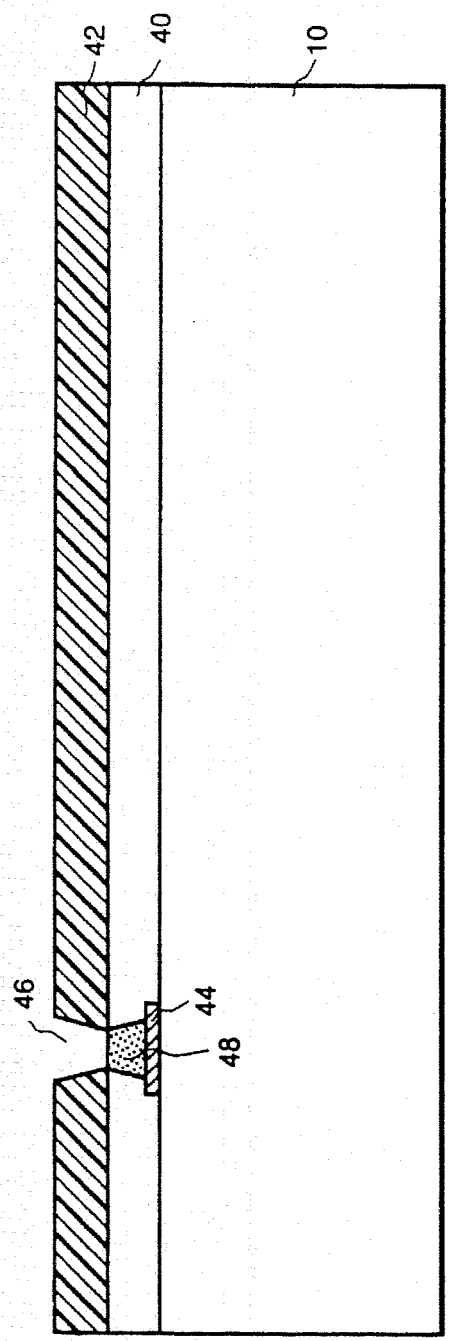
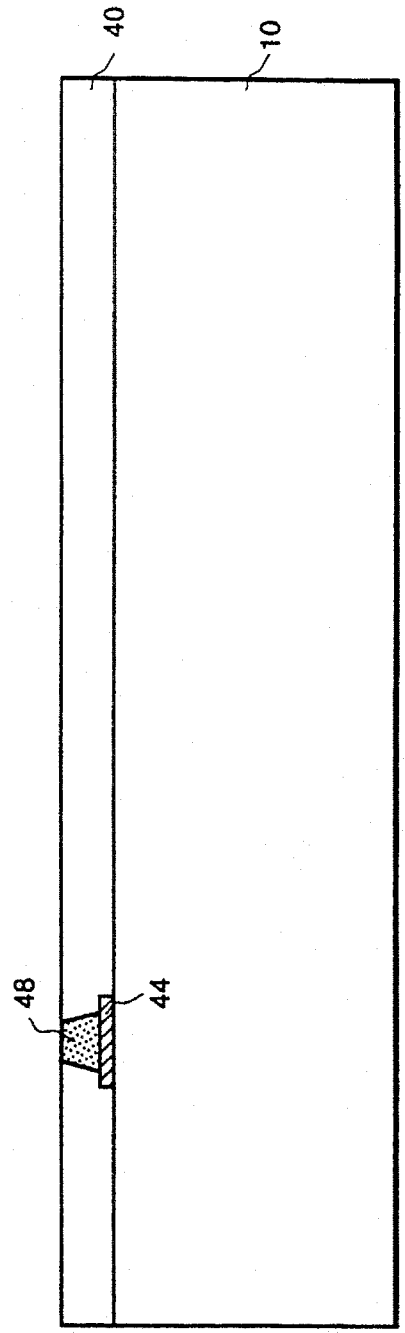
FIG. 14
FIG. 15

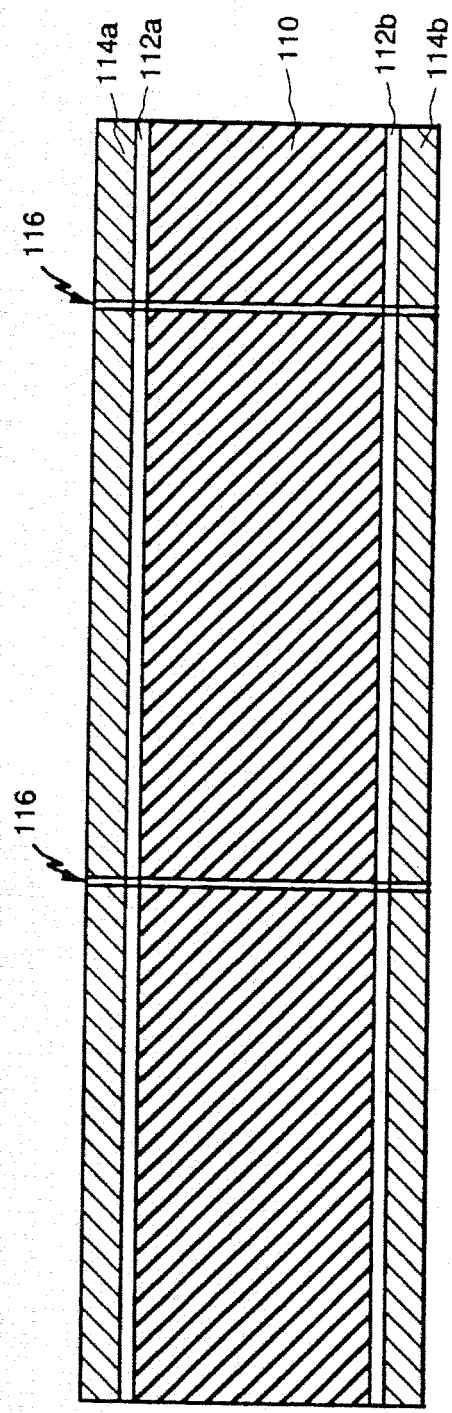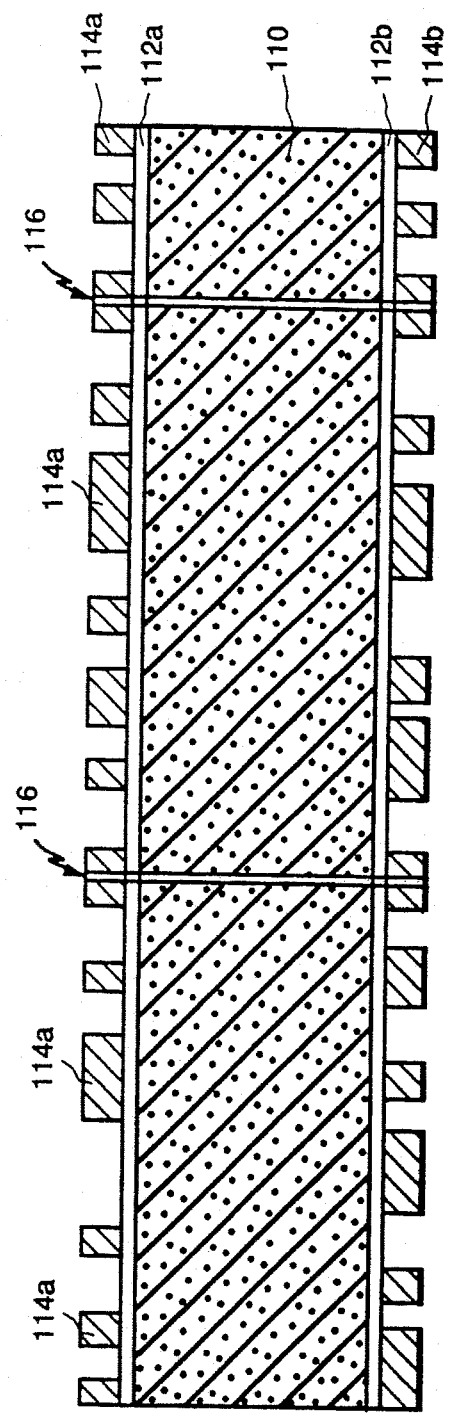
FIG. 18
FIG. 19

PROCESSING LOW DIELECTRIC CONSTANT MATERIALS FOR HIGH SPEED ELECTRONICS

This application is a division of application Ser. No. 08/247,820, filed May 23, 1994 now U.S. Pat. No. 5,449,477.

BACKGROUND OF THE INVENTION

1. Field of the Invention

This invention relates generally to low dielectric constant porous materials and, more particularly, to a process for using porous layers in printed circuit boards and over electronic circuits and supporting substrates.

2. Description of the Related Art

Electronic circuits have inherent limitations in high frequency applications. For example, capacitive loading is increased at higher frequencies because capacitive reactance is directly proportional to frequency. In high frequency circuits capacitive loading becomes so high that a semiconductor chip cannot drive the low reactive impedance. Because these high frequency circuits have historically been power inefficient, their usefulness in airborne and satellite applications is limited.

Foam cored cable technology has been used for years in attempts to reduce capacitive loading of electronic signals. Porous polytetrafluoroethylene (PTFE) materials such as GOR-TEX™ (GOR-TEX is a trademark of W. L. Gore & Associates, Inc., of Newark, Del.) have excellent low dielectric constant properties, but unfortunately they absorb process chemicals in their pores during MCM (multichip module) or PC (printed circuit) board processing that cannot be removed. Additionally, the fact that the porous material deforms during pressurized processing destroys its porous properties, and therefore the deformed material does not provide the desired consistent low dielectric constant.

In microwave circuit chip structures, certain electrical conductor paths in sensitive areas of the chip circuitry require a dielectric constant close to that of air (1) to work properly in these areas. Chip manufacturers fabricate air bridges to provide the low dielectric constant. These sensitive air bridge structures create processing challenges for both the manufacturer and the end user. Even Teflon polytetrafluoroethylene (Teflon is a trademark of E. I. DuPont de Nemours and Co.), which typically has a dielectric constant between 1.9 and 2.0, can create too much of an impedance loading effect at microwave frequencies.

The DuPont Teflon polytetrafluoroethylene line of materials has intrinsically low dielectric constants and has the necessary high temperature stability for most industrial and military uses. As described in Gore, U.S. Pat. No. 3,962,153, and Gore, U.S. Pat. No. 4,096,227, GOR-TEX material is a Teflon PTFE-based material that is filled with micro-pores that create a foam-like cloth material. Porous PTFE material is generally used in clothes to simultaneously provide warmth and allow perspiration and moisture vapors to vent through its pores. Porous PTFE material is alternatively sold as a filled porous PTFE material. Filling the pores with a material such as an acrylate glue enables use of the material as a laminant film; however, this causes the resultant dielectric constant to degrade and limits the material's usefulness at high frequencies. Unfilled porous PTFE material is an excellent candidate for high frequency circuits because the dielectric constant can be significantly less than that found in other materials. However, in laminant applications and processing, the pores can collapse under pressure and/or be filled with processing materials during fabrication which cannot be easily removed.

Ceramic foam materials are discussed, for example, in "Giants in advanced ceramics," Ceramic Industry, vol. 141, 47 (August 1993), and Te-Kao Wu, "Dielectric properties measurement of substrate and support materials," Microwave and Optical Technology Letters, vol. 3, 283–286 (August 1990). These materials, however, are inflexible and not fabricated in large area sections. Because the ceramic foam materials are inflexible, they can be used as substrates but cannot be used in overlay technologies that are not perfectly flat. Because ceramic foam materials are fragile, they are typically not capable of withstanding PC board lamination processing in their intrinsic state. Furthermore, ceramic foam materials can be filled with processing materials which degrade their low dielectric constant.

Another problem common to both porous PTFE material and ceramic foam material is that if the porous/foam material is to be used in any process in which a metallization layer is applied over the material, the metal tends to extend into the pores and it is thus difficult to achieve a smooth and continuous metal surface for use in high frequency applications where skin-effect related losses are of importance.

Few intrinsically low dielectric constant materials can withstand the high temperatures in commercial and military processing. Most of the low dielectric constant materials that can withstand higher temperatures are only absorptive below the 200 nanometer wavelength region of the light spectrum, and thus it is nearly impossible to process those materials using ion argon and other CW (continuous wave) lasers.

Polymer materials in high frequency circuits are preferably laser ablatable by ultraviolet light in order to form the via openings through which different layers of metallization are connected. Laser processing (ablation, photoresist exposure, etc.) is normally done with several passes of the laser beam with a power ranging from 0.5 to 2.0 watts, with a preferred maximum power level being about 1.5 watts. Thus, when a dielectric layer is characterized as being laser ablatable, it means that such layer can be totally removed by progressive passes of a laser beam of this power level, and when it is characterized as not being laser ablatable, it means that a layer is not completely removed by progressive passes of such a laser beam. One method of adaptive laser ablation is discussed in Eichelberger et al., U.S. Pat. No. 4,835,704. Most polytetrafluoroethylene materials are not laser ablatable and generally do not easily adhere to other materials. A method of modifying the ultraviolet absorption characteristics of a polymer material with the addition of an ultraviolet absorbing dye is discussed by Cole et al., U.S. Pat. No. 5,169,678.

To minimize the complexity and cost of equipment for fabricating high density interconnect structures, it is considered desirable to be able to do all laser processing at a single frequency in order that only a single laser is required. Accordingly, preferred materials are those which can be processed at a laser frequency of 351 nm. This frequency was selected in accordance with the characteristics of desirable dielectric layers such as Kapton™ polyimide (Kapton is a trademark of E. I. DuPont de Nemours and Co.) and the fact that there are commercial photoresists which can be processed at this frequency. Ultem™ polyetherimide resin (Ultem is a registered trademark of General Electric Co.) has been used as an adhesive layer in this high density interconnect structure for bonding Kapton polyimide to the underlying structures. The Ultem polyetherimide resin is laser ablatable at 351 nm.

PC boards typically have dielectric constants ranging from 2 through 5, and nonporous ceramics can have dielectric constants as high as 9. It would be desirable to have a low dielectric constant PC board material for use in high frequency and high speed electronics.

SUMMARY OF THE INVENTION

Accordingly, an object of the present invention is to provide a new material and method of manufacturing high frequency and high speed electronic circuits with low power capabilities.

Another object of this invention is to provide a method for processing low dielectric constant porous materials which does not leave process chemicals behind in the porous materials.

Another object of this invention is to provide a method for adding materials to the pores of the porous material that allow laser processing at an ultra-violet (UV) wavelength of about 350 nanometers (nm).

Another object of this invention is to provide low dielectric constant polymer and ceramic PC boards.

This invention modifies a low dielectric constant polymeric porous material, such as porous PTFE material, which has a dielectric constant of approximately 1.2–1.3, by filling the material's pores with a sublimable (or otherwise removable) material that prevents deformation and enables laser processing during high speed circuit fabrication. The term "low dielectric constant" is intended to mean a dielectric constant as close to 1 as possible and not greater than about 2. After processing, the filler material is removed, and the original porous material is left with the intrinsically low dielectric constant. The process, which enables foam-like materials to be laminated and laser machined without the use of solvents or other chemical processing, can be used in PC boards, MCM modules, and anywhere else low dielectric constant surfaces are desired.

Porous PTFE material is approximately 70% air and is generally made by stretching PTFE to cause approximately nine billion holes per square inch to be distributed evenly throughout its volume. This porous structure is composed of mostly air and can readily be filled with a sublimable material. The resulting porous material can be used as a low dielectric constant material in the manufacture of high frequency circuits and can reduce the need for laser ablation of material situated over air bridge structures and other microwave structures and devices.

Briefly, in accordance with a preferred embodiment of the invention, a method for applying a low dielectric constant material over a substrate comprises dispersing an additive material in a low dielectric constant layer; attaching the layer to a surface of the substrate; and removing the additive material from the layer. In one embodiment the low dielectric constant layer is a porous layer comprising polytetrafluoroethylene. The step of removing the additive material from the layer comprises subliming, evaporating, and/or diffusing away the additive material. The substrate can support a circuit chip having chip pads on a connection surface. In this embodiment the step of attaching the porous layer to the surface of the substrate includes attaching the porous layer to the connection surface of the circuit chip, and further steps include forming at least one via in the porous layer extending to at least one of the chip pads and applying a pattern of electrically conductive material over the porous layer extending into the at least one via.

In accordance with another preferred embodiment of the invention, a method for applying and ablating a low dielectric constant material over a substrate comprises attaching a low dielectric constant polymer layer to a surface of the substrate; applying mask material over the polymer layer; forming a via in the mask material extending through to the polymer layer; diffusing an additive material in a region of the polymer layer through the via in the mask material; removing the mask material; and ablating at least some of the polymer layer in the region where the additive material was diffused.

In accordance with another preferred embodiment of the invention, a method for fabricating a low dielectric constant printed circuit board comprises dispersing an additive material in a low dielectric constant layer; applying an adhesive over at least one side of the low dielectric constant layer; applying a metallization layer over the adhesive; providing a plurality of holes through the low dielectric constant layer, the adhesive, and the metallization layer; patterning the metallization layer; and removing the additive material from the low dielectric constant layer.

In accordance with another preferred embodiment of the invention, a structure comprises a substrate, a circuit chip having chip pads and supported by the substrate, a low dielectric constant porous layer situated over the substrate and circuit chip and having at least one via therein aligned with at least one of the chip pads, and a pattern of electrical conductors extending over a portion of the porous layer and into the at least one via.

In accordance with another preferred embodiment of the invention, a low dielectric constant printed circuit board comprises a low dielectric constant layer, an adhesive overlying at least one side of the low dielectric constant layer, a patterned metallization layer over the adhesive, and a plurality of holes through the low dielectric constant layer, the adhesive, and the metallization layer. In one embodiment, the low dielectric constant layer comprises a ceramic material.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIGS. 6–9 are views showing steps in another process for applying a low dielectric constant porous layer over a selected surface;

FIGS. 12–16 are views showing steps in a process for enabling laser ablation of low dielectric constant porous material; and FIGS. 17–19 are views showing steps in a process for forming a low dielectric constant printed circuit board.

DETAILED DESCRIPTION OF A PREFERRED EMBODIMENT OF THE INVENTION

Figure 1:
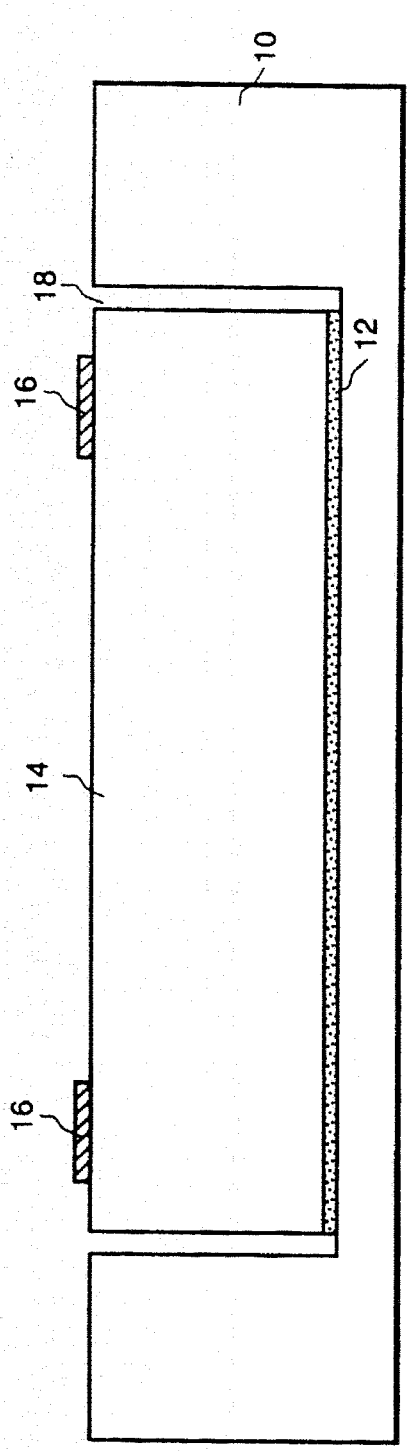
FIGS. 1–5 are views showing steps in a process for applying a low dielectric constant porous layer over a selected surface.

FIGS. 1–5 are views showing steps in a process for applying a low dielectric constant porous material over a selected surface. In the view of FIG. 1, a semiconductor chip 14, which for example may comprise a GaAs (gallium arsenide) chip having chip pads 16, is attached with an adhesive 12 in a chip well 18 of a milled substrate 10. The substrate may comprise any suitable structural material such as, for example, aluminum nitride or beryllium oxide. Adhesive 12 may comprise a material such as Ultem polyetherimide resin or silicone epoxy which can withstand high temperature processing.

Figure 2:
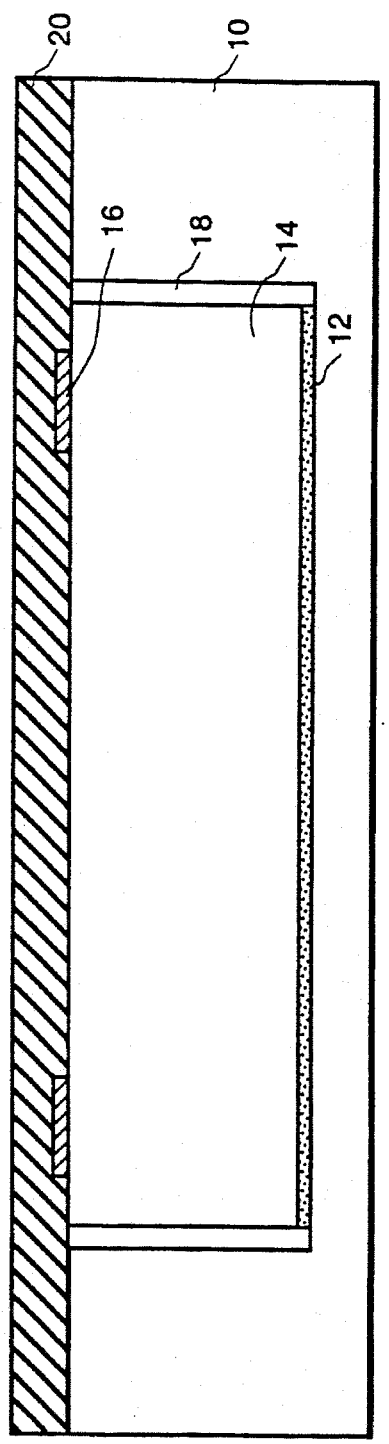

As shown in FIG. 2, a low dielectric constant porous layer 20 is applied over the surfaces of substrate 10 and chip 14. In one embodiment the porous layer comprises a porous PTFE material having its pores filled with an additive material. In one example, the pores have diameters ranging approximately from 0.01 to 5 μm.

Although the porous material is preferably a polymer material, other materials such as ceramics and metals can also be used. Expanded PTFE is a useful porous layer because it does not dissolve in most of the fabricating chemicals. Other examples of potentially useful porous material include polyethylene and polystyrene, for example.

The selected additive material must be capable of withstanding high processing temperatures and capable of removal after processing by any appropriate process, such as heat or a combination of heat and applied vacuum.

For example, the additive material may comprise materials such as low melting temperature waxes, anthraquinone (as well as derivatives of anthraquinone such as alizarin), and other sublimable organic solids, such as adipic and other dicarboxylic acids. Some of these additive materials may require vacuum and heat combinations to sublime, whereas others tend to diffuse or evaporate from the material. A short list of sublimable materials can be found in the Handbook of Chemistry and Physics, 60th Ed. pages C-722–723. Many of the listed materials can be readily used with this invention. A combination of several additive materials may be desirable to provide a removable material which can absorb appropriate wavelengths for laser ablation.

Porous layer 20 is heated to the softening point under pressure and attached to the substrate surface to achieve a bonded laminate. The pressure and temperature parameters are chosen so that the additive material does not significantly sublime, diffuse, or evaporate during the attachment. The outer porous layer surface can have another coating of the additive material added to refresh the surface after lamination.

Figure 3:
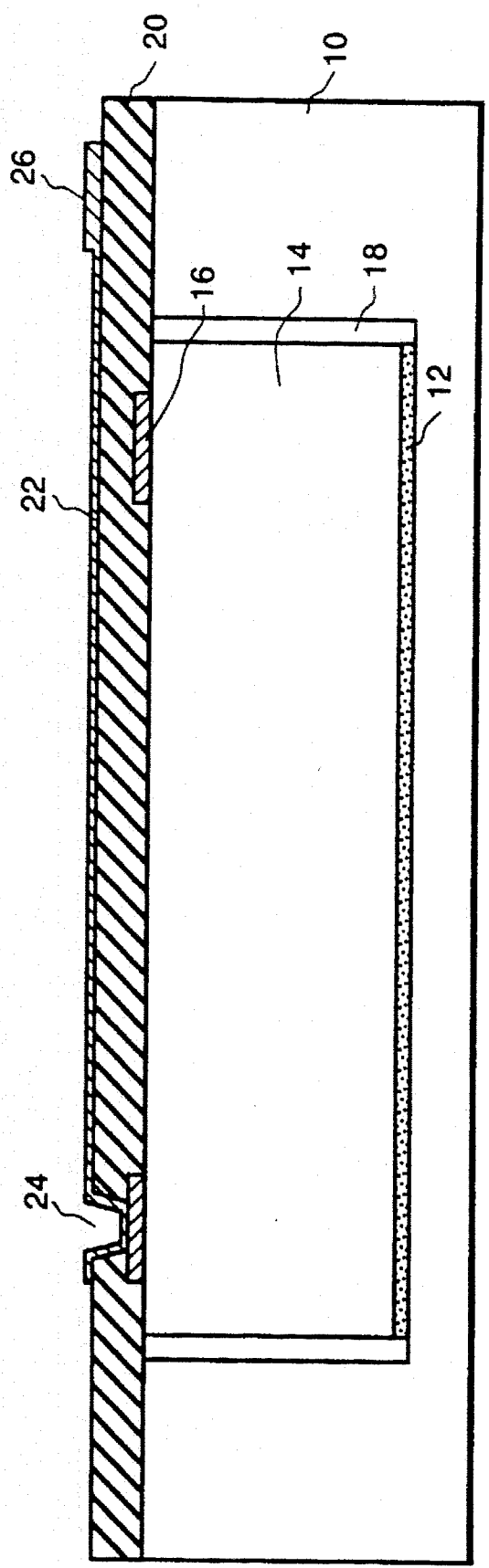

Either an adaptive laser, such as described in aforementioned Eichelberger et al., U.S. Pat. No. 4,835,704, or a mask process is then used to form via openings 24 over selected chip pads 16, as shown in FIG. 3. Although, layers such as porous PTFE are not typically laser ablatable using the preferred wavelengths, the process of filling the pores of porous layer 20 with additive material causes the porous layer to be laser ablatable, as further discussed below.

After the vias are cleaned, a layer of electrically conductive material is applied over porous layer 20 and patterned to form a pattern of electrical conductors 22 which, in a preferred embodiment, includes a bonding pad 26. In one embodiment the pattern of electrical conductors comprises a buffer layer of metallization such as titanium or chromium covered by a layer of copper which in turn is covered by a second buffer layer. These metals can be patterned with standard photoresist techniques, as discussed in Eichelberger et al., U.S. Pat. No. 4,783,695.

Figure 4:
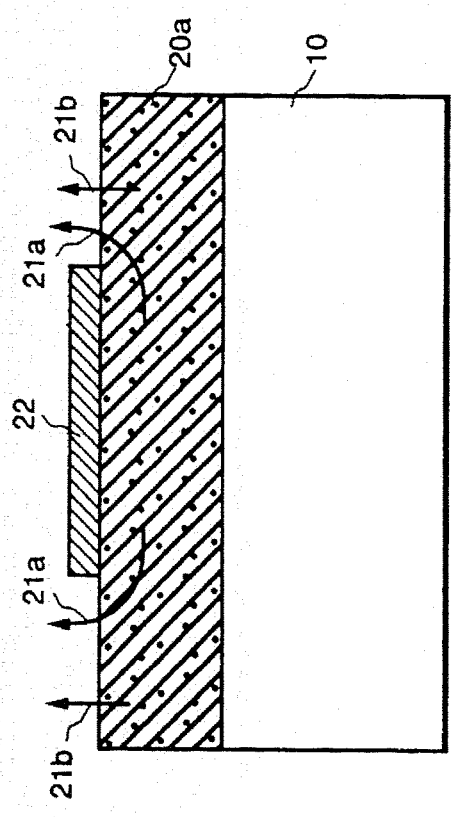
Figure 5:
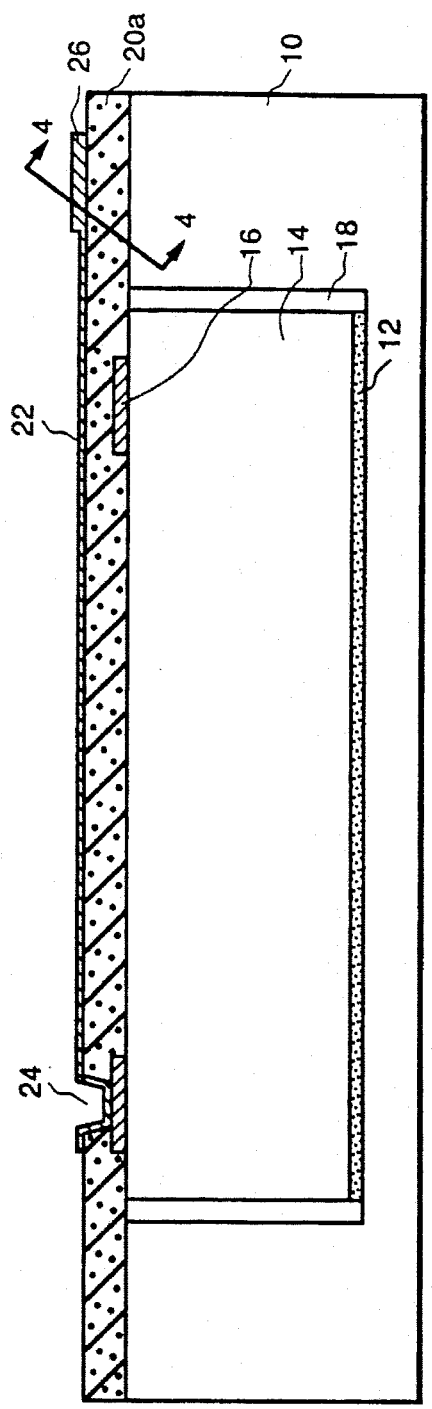
Figure 6:
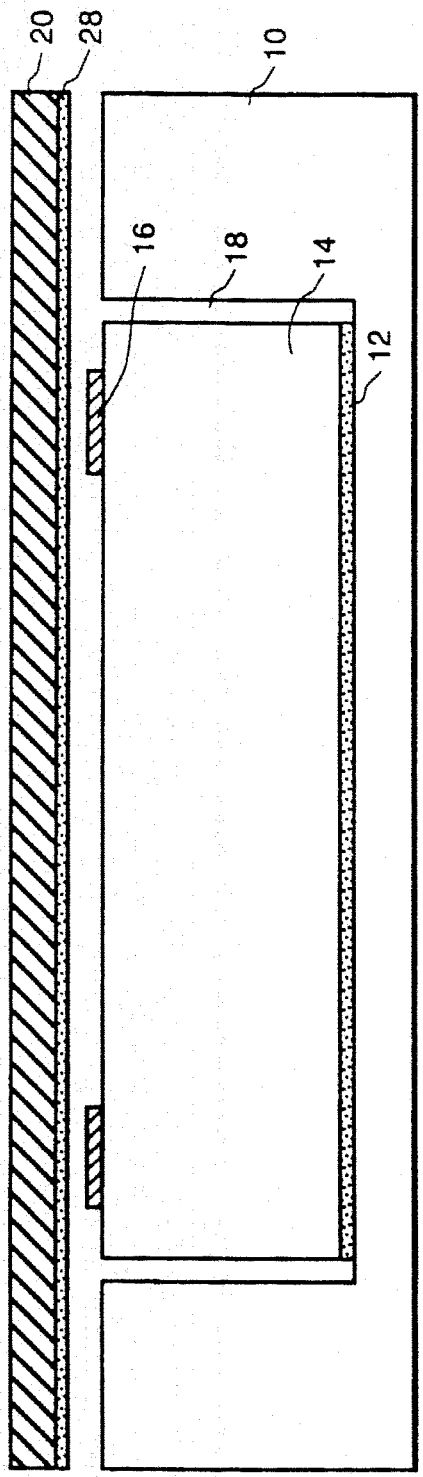

As shown in FIGS. 4 and 5, the additive material is then removed from from the additive-filled porous layer 20 to form an additive-free porous layer 20a. FIG. 5 is a sectional side view similar to that of FIG. 3. FIG. 4 is an enlarged sectional side view along line 4–4' of FIG. 5. Substrate 10 can be heated (either with or without vacuum conditions, depending on the additive material) to sublime, diffuse, or evaporate the additive material. Because the additive material does not sublime directly through the pattern of electrical conductors 22, additive material under the pattern of electrical conductors has a longer release path 21a as compared with the release path 21b of additive material not under the pattern of electrical conductors. The longer release path may require a longer heating period.

The removal of additive material dyes dissolved or dispersed in a polymer matrix occurs through a mechanism of interdiffusion. Dye molecules such as anthraquinone or alizarin are relatively small molecules and fit between the spaces of the coiled polymer chains which preferably make up the porous layer. When heated above the sublimation temperature, the individual dye molecules, in the gas phase, will vent or pass through these spaces and be released from the porous layer.

Because the additive material is removed after the application of the pattern of electrical conductors, the metal does not significantly protrude into the porous layer and thus has a smooth surface as required for low loss high frequency applications.

Although this invention has been discussed with the concept of using a porous material, the porous layer may alternatively comprise a polymer without specially formed pores. The interdiffusion rate will be slower for such polymers than for porous materials because there will be less volume of free space; however, the sublimable additive material molecules still diffuse through the spaces in polymers without specially formed pores to the surrounding atmosphere. The diffusion rate depends on the temperature, pressure, polymer thickness, and permeability of the polymer matrix.

Certain light frequencies, such as UV (ultraviolet), aid in the decomposition of the additive material. UV light acts to scission the material and thus create smaller molecules which can move easily and pass out of the porous materials.

FIGS. 6–9 are views showing steps in a process for applying a low dielectric constant porous layer similar to the process steps shown in FIGS. 1–5 with the addition of an amorphous adhesive 28 having a low dielectric constant, such as available from DuPont under the name AF 1600 or 2400 Teflon polytetrafluoroethylene, that maintains excellent adhesion to the porous layer after the additive material is removed. Another potentially useful adhesive with a low dielectric constant is polyphenylene oxide. These low dielectric adhesives are preferably doped with an ultraviolet light absorbing dye as discussed in aforementioned Cole et al., U.S. Pat. No. 5,169,678.

In this embodiment, porous layer 20 is immersed and soaked in the additive material which is dissolved in a solvent. Ion implantation, pressure, or a combination of pressure and heat can be used to increase the permeation of the additive material throughout the porous layer.

After the porous layer and additive material have dried, adhesive 28 is either applied to porous layer 20 or applied to the substrate surface directly. It is helpful to position the additive material in the pores of the porous layer prior to the application and lamination of the porous layer to the substrate surface to prevent the adhesive from wicking or protruding into the pores. Thus the removal of the additive material from the porous layer can be accomplished while maintaining sufficient adhesion of the porous layer to the surface.

Figure 7:
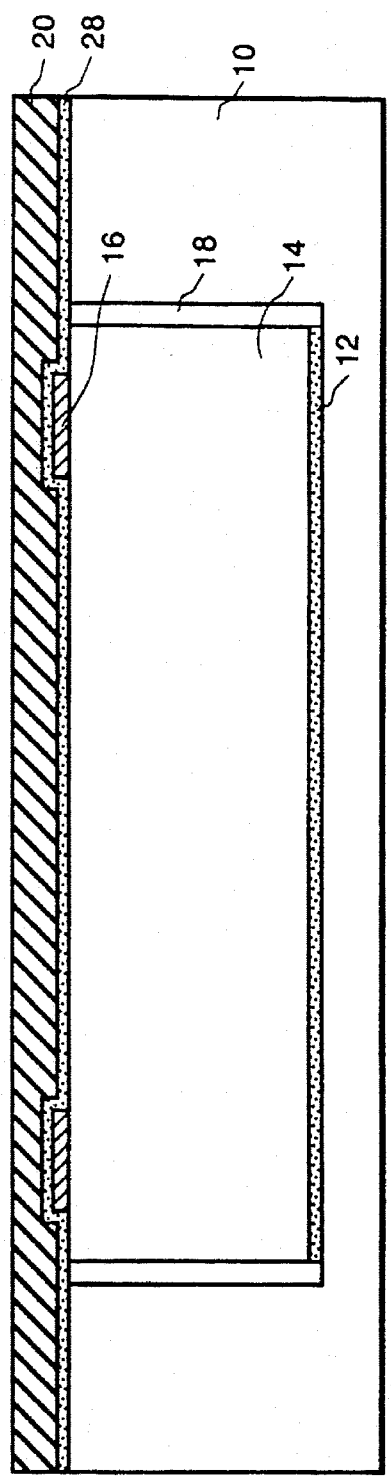

FIGS. 7–9 illustrate views of process steps similar to those of FIGS. 2, 3, and 5, respectively, but do not require as much heat to obtain adhesion of the porous layer to the desired surface. When AF Teflon polytetrafluoroethylene is used as an adhesive, the porous layer can attain adequate adhesion to substrate and chip surfaces in the temperature range of 225° C.–250° C. The step of forming a via opening 24 through porous layer 20 includes forming a corresponding via through adhesive 28.

The addition of the thin adhesive 28 increases the dielectric constant above the surface because dielectric constants generally act in series and are proportional to the relative thicknesses of the adjacent materials. When the porous layer is much thicker than the adhesive, however, the dielectric constant can approach that of the porous layer and be suitably low.

Figure 10:
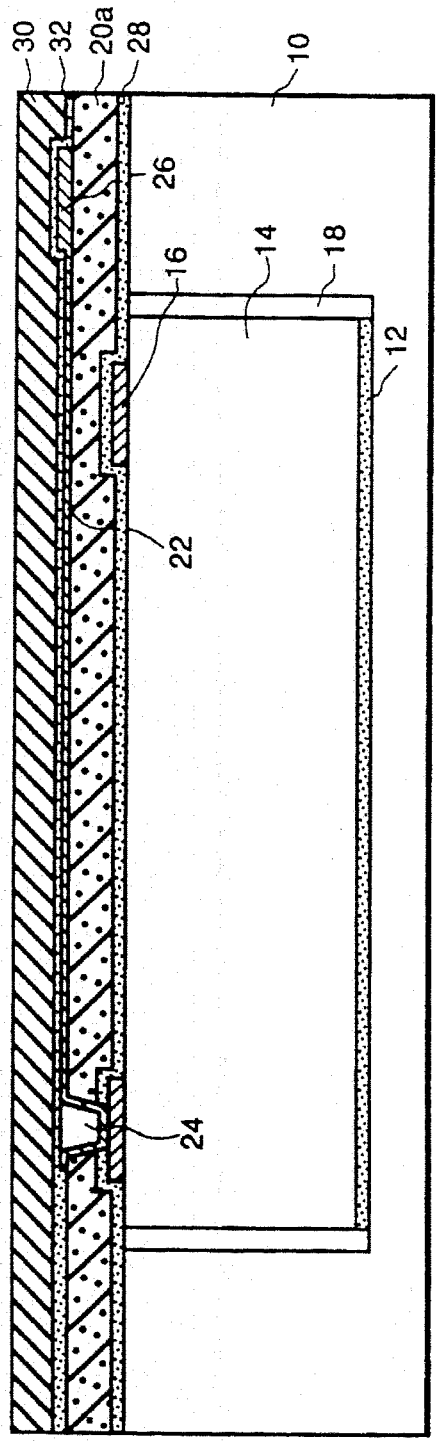
FIGS. 10–11 are views showing steps in a process for applying multiple low dielectric constant porous layers.
Figure 11:
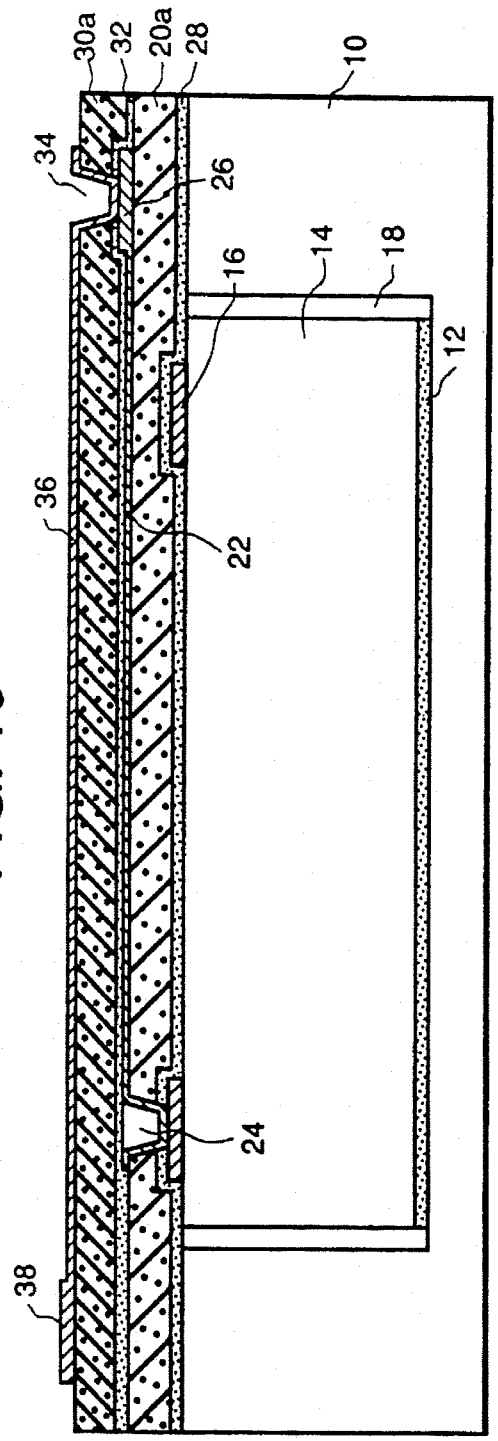

FIGS. 10–11 are views showing steps in a process for applying multiple low dielectric constant porous layers. In FIG. 10, a second additive filled porous layer 30 is applied with a second adhesive 32 to the outer surface of porous layer 20a of the structure shown in FIG. 9. The second porous layer and all subsequent layers can be processed as described with respect to FIGS. 7–9 above by forming a via opening 34 extending to a portion of the pattern of electrical conductors 22, applying a second pattern of electrical conductors 36, and removing the additive material to result in the structure shown in FIG. 11. The second adhesive is thin and therefore does not fill the lower vias 24, thus providing an air dielectric constant (about 1) in the metallized via areas.

In a multilayer structure, not all the layers need be applied as additive material filled porous layers. Other materials, such as Kapton polyimide (Kapton is a trademark of E. I. DuPont de Nemours and Co.), for example, can be used in combination with porous layers. The high speed or high frequency porous layers need only be placed where desirable.

Instead of removing the additive material after each layer is applied, several layers can be processed before attempting to remove the additive material. When removing additive material from several layers simultaneously a longer heating period will be required than the period for removing additive material from a single layer.

In one embodiment, the porous layers and adhesives all comprise polytetrafluoroethylene. This embodiment uses two different DuPont AF Teflon polytetrafluoroethylene materials such as AF 1600 for adhesives 28 and 32 and AF 2400 for porous layers 20 and 30. These two materials have sufficiently different melting points so that when AF 2400 is a solid the AF 1600 can melt and function as a bonding glue.

AF Teflon polytetrafluoroethylene materials can have various sublimable materials added that will enable 248–365 nm laser ablation and that can be subsequently be removed by heat or heat and vacuum conditions. Several examples of such additive materials include the above-discussed low melting temperature waxes, anthraquinone and its derivatives, and other sublimable organic solids. Using these additive materials enables a material that is optically transparent to approximately 200 nm to be laser processable at more conventional laser frequencies such as pulsed excimer lasers at frequencies of 248 nm, 266 nm, 308 nm, and 351 nm, and ion argon or krypton lasers at frequencies of at 350–365 nm and 325 nm, respectively, and subsequently be removed.

The AF Teflon polytetrafluoroethylene layers will release the additive material easily because the materials can be heated near the Tg (glass transition temperature) where the additive material is passed by permeation through the softened material with ease. This process is time, thickness, temperature, and pressure dependent.

An AF 2400 Teflon polytetrafluoroethylene porous layer can be film cast onto a release plate and an AF 1600 Teflon polytetrafluoroethylene adhesive material can be applied over the top of the porous layer without cracking it, enabling a composite structure that can then be laminated to a PC board or MCM structure.

This embodiment can be used to reduce the impedance loading which occurs when using high dielectric constant materials. Some circuit chip manufacturers employ air bridges to obtain low impedance loading on critical areas of GaAs microcircuits. Typically, when these chips are situated in an integrated circuit, any overlying and underlying material must be removed in the area of the air bridges for optimal performance. This invention may reduce the need to remove material and thus enable new chip interconnection structures to be fabricated.

Figure 12:
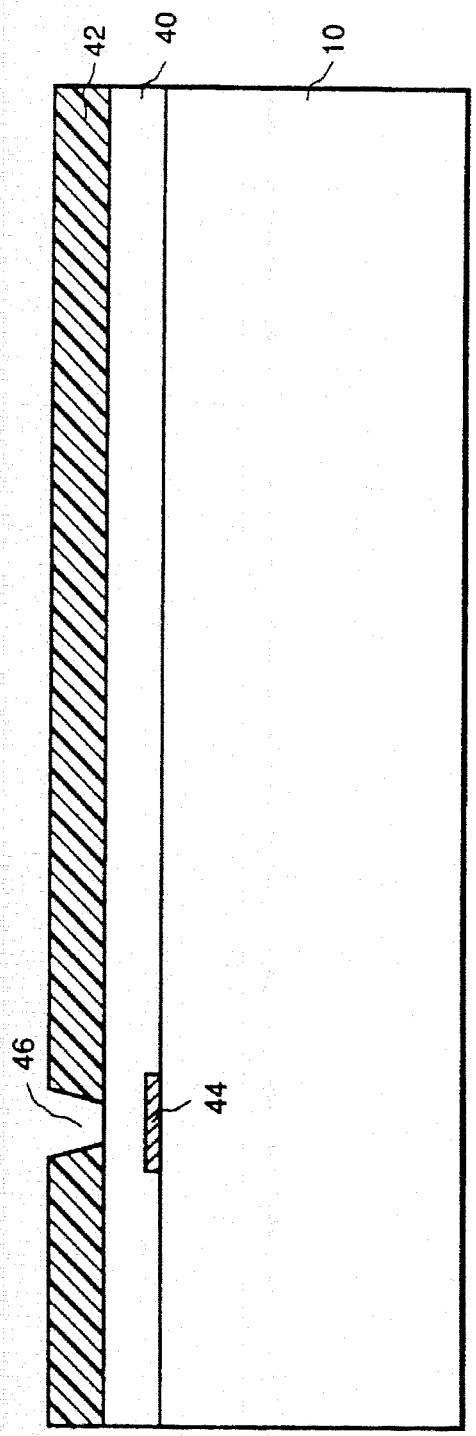

FIGS. 12–16 are views showing steps in a doping process for enabling laser ablation of low dielectric constant porous layer 40. The porous layer is first applied to a substrate 10 surface, as discussed with respect to FIG. 2, but without the additive material. Then, in a preferred embodiment, a laser ablatable mask material 42, such as Kapton polyimide for example, is deposited over the outer surface of the porous layer. A via opening 46 over a portion of an electrical conductor 44 is formed in the mask material revealing the porous layer, as shown in FIG. 12. The via is preferably formed with an argon laser, but can also be formed using other conventional methods such as plasma or reactive ion etching, for example.

Figure 13:
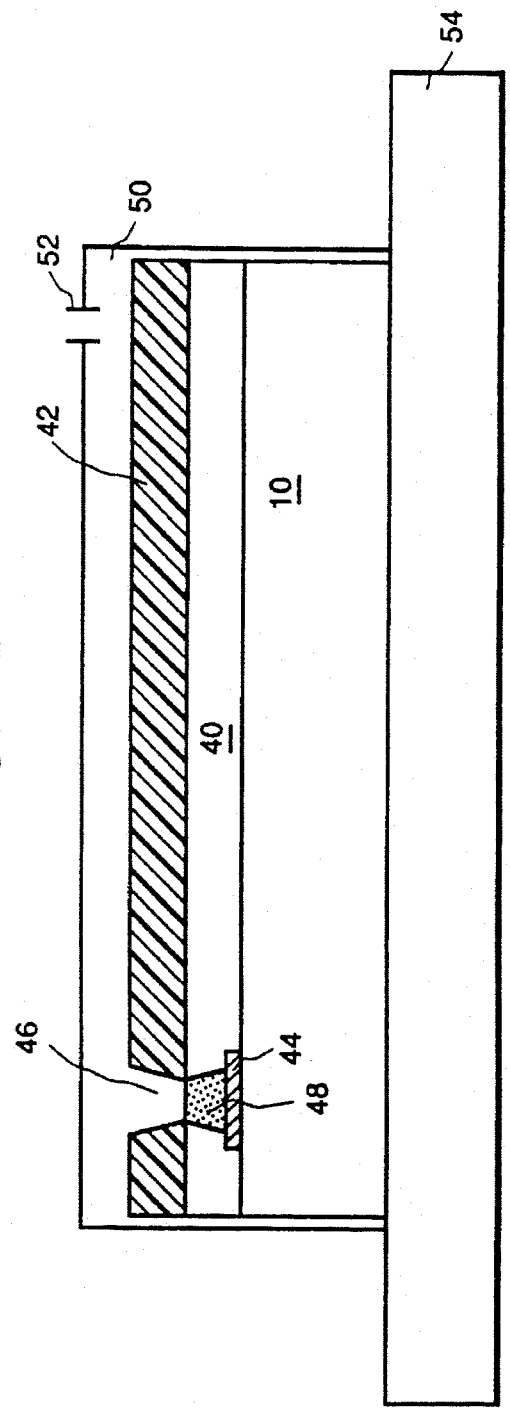
Figure 16:
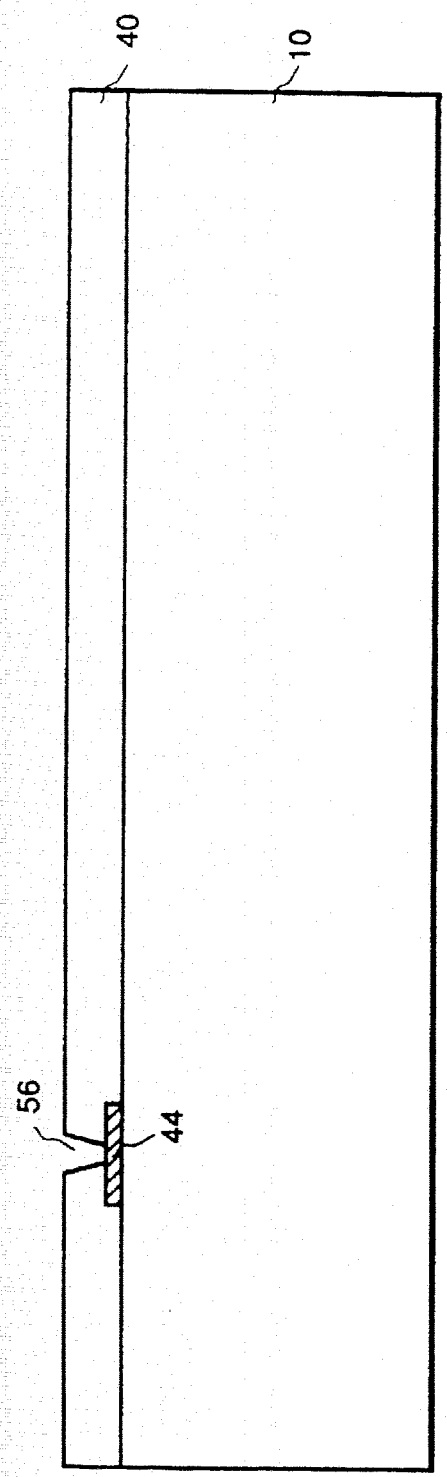

As shown in FIG. 13, the additive material can be supplied to porous layer 40 in a pressure vessel 50 through a pressure port 52 using a heat source 54. The dopant may comprise a light absorbing dye such as discussed in aforementioned Cole et al., U.S. Pat. No. 5,169,678. Mask material 42 limits doping or diffusion to the localized areas 48 where the vias have been formed to cause permeation of the of the additive material for enabling laser ablation at CW argon ion laser frequencies. If desired, mask material 42 can also be applied over the side edges of the porous layer to prevent doping of the side edges. Slight doping which may occur along the edges of the porous layer, however, does not present any problems.

FIG. 14 illustrates a doped region ready for laser processing. Once the desired via areas are doped with the additive material to enable localized laser ablation, the mask material can be removed, as shown in FIG. 15, and a laser can be used to produce vias in the porous layer where the additive material was doped because of the selective absorption of the excimer laser energy in the doped via areas. After via formation, any remaining dopant material can be removed by a process such as sublimation, for example, leaving the material again transparent to the excimer laser's light energy, as shown by via 56 in FIG. 16.

Figure 17:
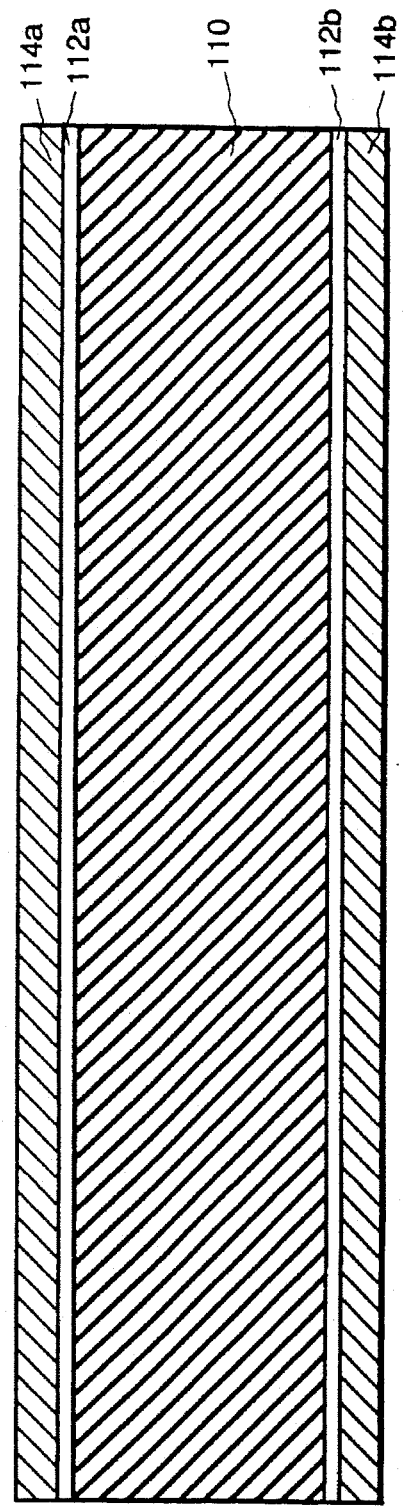

FIGS. 17–19 are views showing steps in a process for forming a low dielectric constant printed circuit board. First, a porous layer 110 is filled with additive material as described with respect to FIG. 2. The porous layer is preferably coated on both sides with thin layers of an adhesive material 112a and 112b, comprising a material such as AF 1600 or 2400 Teflon polytetrafluoroethylene, which in turn are coated with respective layers of metallization 114a and 114b, comprising a material such as copper, as shown in FIG. 17. In one embodiment DuPont FEP or PFA Teflon polytetrafluoroethylene is applied with a pinch roll laminator such as used in PC board processing.

Next, as shown in FIG. 18, holes 116 are punched or drilled through the porous material, adhesive, and metallization, and, as shown in FIG. 19, the layers of metallization are patterned to form metallization lines on the board. In one embodiment, the patterning is performed using a layer of photoresist (not shown) which is removed after patterning. If desired, any adhesive left exposed after the patterning of the metallization layer can be removed by RIE (reactive ion etching). After the metallization lines are fabricated, electronic components can be inserted in the board, and removal of the additive material is accomplished by sublimation, evaporation, and/or diffusion, as discussed above.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for applying and ablating a low dielectric constant material over a substrate, comprising the steps of:

attaching a low dielectric constant porous polymer layer to a surface of the substrate;

applying mask material over the polymer layer;

forming a via in the mask material extending through to the polymer layer;

diffusing an additive material in a region of the polymer layer through the via in the mask material;

removing the mask material; and ablating at least some of the polymer layer in the region where the additive material was diffused.

2. The method of claim 1, further including the final step of removing any remaining additive material from the polymer layer by sublimation.

3. The method of claim 2, wherein the polymer layer comprises a polytetrafluoroethylene and the mask material comprises a polyimide.

4. The method of claim 1, wherein the polymer layer comprises a material selected from the group consisting of polytetrafluoroethylene, polyethylene, and polystyrene.

5. The method of claim 4, wherein the additive material comprises a material selected from the group consisting of wax, anthraquinone, and sublimable organic solids.

* * * * *